United States Patent
Matsushita et al.

(10) Patent No.: US 10,008,682 B2
(45) Date of Patent: *Jun. 26, 2018

(54) ORGANIC SEMICONDUCTOR COMPOSITION, ORGANIC THIN FILM TRANSISTOR, ELECTRONIC PAPER AND DISPLAY DEVICE

(71) Applicant: FUJIFILM CORPORATION, Tokyo (JP)

(72) Inventors: Yasuaki Matsushita, Kanagawa (JP); Tokihiko Matsumura, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 211 days.

This patent is subject to a terminal disclaimer.

(21) Appl. No.: 14/988,043

(22) Filed: Jan. 5, 2016

(65) Prior Publication Data

US 2016/0155964 A1    Jun. 2, 2016

Related U.S. Application Data

(63) Continuation of application No. PCT/JP2014/067906, filed on Jul. 4, 2014.

(30) Foreign Application Priority Data

Jul. 31, 2013    (JP) ................... 2013-158767

(51) Int. Cl.
     *H01B 1/00*      (2006.01)
     *H01L 51/00*      (2006.01)
     (Continued)

(52) U.S. Cl.
CPC ............ *H01L 51/0094* (2013.01); *C08K 5/00* (2013.01); *H01B 1/121* (2013.01); *H01L 51/005* (2013.01);
(Continued)

(58) Field of Classification Search
CPC . H01B 1/00; H01B 1/12; H01B 1/121; H01B 1/20; C08K 5/00; H01L 31/04
See application file for complete search history.

(56) References Cited

U.S. PATENT DOCUMENTS

2004/0247814 A1    12/2004    Sirringhaus et al.
2007/0051403 A1    3/2007    Itami
(Continued)

FOREIGN PATENT DOCUMENTS

CN      1364323 A    8/2002
CN      102105987 A    6/2011
(Continued)

OTHER PUBLICATIONS

An Office Action; "Decision of Refusal" issued by the Japanese Patent Office dated Jul. 4, 2017, which corresponds to Japanese Patent Application No. 2015-529477 and is related to U.S. Appl. No. 14/988,043; with English language translation.

(Continued)

*Primary Examiner* — Mark Kopec
(74) *Attorney, Agent, or Firm* — Studebaker & Brackett PC

(57) ABSTRACT

The present invention provides an organic semiconductor composition, which improves the insulation reliability of an organic thin film transistor without greatly reducing the mobility of the organic thin film transistor, and an organic thin film transistor, electronic paper, and a display device which are prepared by using the organic semiconductor composition. The organic semiconductor composition of the present invention contains an organic semiconductor material and an anti-migration agent containing at least either a compound X, which contains at least two or more groups selected from the group consisting of a group represented by (Continued)

Formula (A) and a group represented by Formula (B), or a compound Y which is represented by Formula (C).

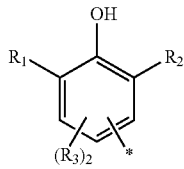

Formula (A)

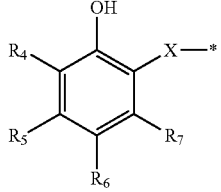

Formula (B)

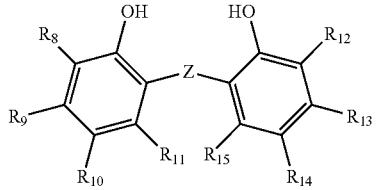

Formula (C)

20 Claims, 1 Drawing Sheet

(51) Int. Cl.
  *C08K 5/00* (2006.01)
  *H01B 1/12* (2006.01)
  *H01L 51/05* (2006.01)
(52) U.S. Cl.
  CPC ...... *H01L 51/0036* (2013.01); *H01L 51/0067* (2013.01); *H01L 51/0558* (2013.01); *H01L 51/0055* (2013.01); *H01L 51/0074* (2013.01)

(56) References Cited

U.S. PATENT DOCUMENTS

| | | | |
|---|---|---|---|
| 2009/0114906 | A1 | 5/2009 | Kanitz |
| 2011/0121281 | A1 | 5/2011 | Kotake et al. |
| 2013/0299807 | A1 | 11/2013 | Rostovtsev et al. |
| 2013/0306151 | A1 | 11/2013 | Mustonen et al. |
| 2014/0306212 | A1* | 10/2014 | Kaihovirta ............. C08K 5/005 257/40 |
| 2015/0280132 | A1* | 10/2015 | Forrest ................ H01L 51/4253 136/263 |

FOREIGN PATENT DOCUMENTS

| | | |
|---|---|---|
| JP | 2005-005582 A | 1/2005 |
| JP | 2009-507385 A | 2/2009 |
| JP | 2011-187868 A | 9/2011 |
| WO | 2010/010791 A1 | 1/2010 |
| WO | 2011/157779 A1 | 12/2011 |
| WO | 2012095796 A1 | 7/2012 |
| WO | 2012/112530 A2 | 8/2012 |
| WO | 2012/118174 A1 | 9/2012 |
| WO | 2013072853 A1 | 5/2013 |

OTHER PUBLICATIONS

The extended European search report issued by the European Patent Office dated Jul. 28, 2016, which corresponds to European Patent Application No. 14831689.6-1555 and is related to U.S. Appl. No. 14/988,043.

An Office Action issued by the Chinese Patent Office dated Mar. 16, 2017, which corresponds to Chinese Patent Application No. 201480038721.X and is related to U.S. Appl. No. 14/988,043; with partial English language translation.

An Office Action; "Notification of Reasons for Refusal," issued by the Japanese Patent Office dated Dec. 20, 2016, which corresponds to Japanese Patent Application No. 2015-529477 and is related to U.S. Appl. No. 14/988,043; with English language translation.

Notification of Transmittal of Translation of the International Preliminary Report on Patentability and Translation of Written Opinion of the International Searching Authority; PCT/JP2014/067906 dated Feb. 11, 2016.

International Search Report—PCT/JP2014/067906 dated Aug. 19, 2014.

* cited by examiner

ORGANIC SEMICONDUCTOR COMPOSITION, ORGANIC THIN FILM TRANSISTOR, ELECTRONIC PAPER AND DISPLAY DEVICE

This application is a Continuation of PCT International Application No. PCT/JP2014/067906 filed on Jul. 4, 2014, which claims priority under 35 U.S.C. § 119(a) to Japanese Patent Application No. 2013-158767 filed on Jul. 31, 2013. Each of the above application(s) is hereby expressly incorporated by reference, in its entirety, into the present application.

BACKGROUND OF THE INVENTION

1. Field of the Invention

The present invention relates to an organic semiconductor composition, an organic thin film transistor, electronic paper, and a display device.

2. Description of the Related Art

In apparatuses using a logic circuit such as a thin film transistor (TFT), RF tag (RFID), or memory used in a liquid crystal display or an organic EL display, an organic semiconductor device having an organic semiconductor film (organic semiconductor layer) composed of an organic semiconductor material is used, because the use of the organic semiconductor device makes it possible to lighten the weight of the apparatus, reduce the cost, and make the apparatus flexible.

In recent years, as expectations for organic thin film transistors have been increased, the improvement of mobility (especially field effect mobility), stability, and the like have been required for the organic thin film transistors.

Under these circumstances, JP2005-5582A discloses an organic thin-film transistor in which an organic semiconductor layer is formed of a composition containing an antioxidant so as to reduce the oxidation-induced deterioration of the organic semiconductor layer. More specifically, in examples of JP2005-5582A, a hindered phenol-based antioxidant (manufactured by NAGASE & CO., LTD.: Irganox 1076), 2,2'-methylenebis(6-tert-butyl-p-cresol) (manufactured by Sumitomo Chemical Co., Ltd.: Sumilizer MDP-S), or the like is used.

SUMMARY OF THE INVENTION

In recent years, a further improvement of the performance of organic thin film transistors has been required. Particularly, it is required to further improve the insulation reliability between a source electrode and a drain electrode without deteriorating mobility.

The inventors of the present invention prepared an organic thin film transistor by using the composition containing an antioxidant specifically disclosed in JP2005-5582A. As a result, it was revealed that either or both of the mobility of the organic thin film transistor and the insulation reliability between a source electrode and a drain electrode do not satisfy the current required level.

The present invention is based on the current circumstances described above, and an object thereof is to provide an organic semiconductor composition, which improves the insulation reliability of an organic thin film transistor without greatly reducing the mobility of the organic thin film transistor, and an organic thin film transistor which is prepared by using the organic semiconductor composition.

As a result of conducting intensive investigation to achieve the aforementioned object, the inventors of the present invention found that predetermined effects can be obtained by mixing an anti-migration agent represented by a predetermined structural formula with an organic semiconductor composition, and accomplished the present invention.

That is, the inventors of the present invention found that the aforementioned object can be accomplished by the following constitution.

(1) An organic semiconductor composition including an organic semiconductor material and an anti-migration agent containing at least either a compound X, which contains at least two or more groups selected from the group consisting of a group represented by Formula (A) that will be described later and a group represented by Formula (B) that will be described later, or a compound Y which is represented by Formula (C) that will be described later.

(2) The organic semiconductor composition described in (1), in which the molecular weight of the compound X and the compound Y is equal to or less than 3,000.

(3) The organic semiconductor composition described in (1) or (2), in which the anti-migration agent is a compound represented by Formula (D) that will be described later.

(4) The organic semiconductor composition described in (3), in which L in Formula (D) is any one selected from the group consisting of groups represented by Formulae (1) to (10) that will be described later.

(5) The organic semiconductor composition described in (1) or (2), in which the anti-migration agent is the compound X, and the total number of the group represented by Formula (A) and the group represented by Formula (B) contained in the compound X is equal to or greater than 3.

(6) An organic semiconductor layer prepared by using the organic semiconductor composition described in any one of (1) to (5).

(7) An organic thin film transistor including an organic semiconductor layer prepared by using the organic semiconductor composition described in any one of (1) to (5), a source electrode, a drain electrode, and a gate electrode.

(8) The organic thin film transistor described in (7), in which at least one electrode selected from the group consisting of the source electrode, the drain electrode, and the gate electrode contains silver.

(9) Electronic paper including the organic thin film transistor described in (7) or (8).

(10) A display device including the organic thin film transistor described in (7) or (8).

According to the present invention, it is possible to provide an organic semiconductor composition, which improves the insulation reliability of an organic thin film transistor without greatly reducing the mobility of the organic thin film transistor, and an organic thin film transistor which is prepared by using the organic semiconductor composition.

DESCRIPTION OF THE PREFERRED EMBODIMENTS

Figure 1:
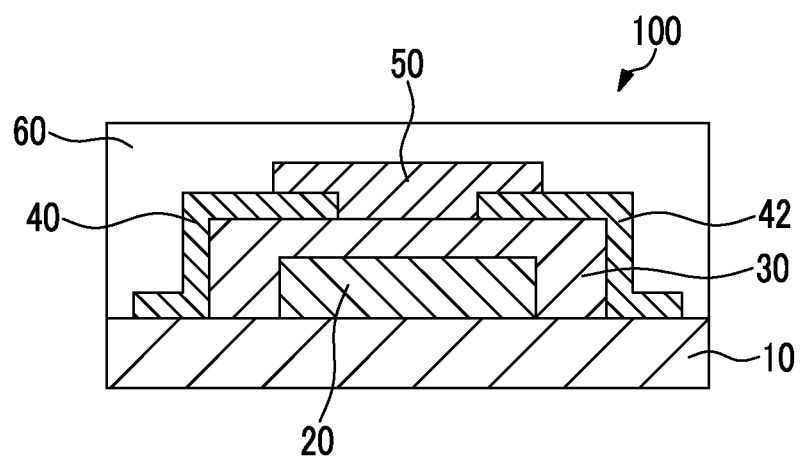
FIG. 1 is a schematic cross-sectional view of an embodiment of an organic thin film transistor of the present invention.

Hereinafter, preferred embodiments of the organic semiconductor composition (a composition for an organic semiconductor or a composition for forming an organic semiconductor layer) and the organic thin film transistor (an organic semiconductor transistor) of the present invention will be described.

The organic semiconductor composition (hereinafter, also simply referred to as a "composition") of the present invention contains an organic semiconductor material and an anti-migration agent (migration inhibitor) selected from predetermined compounds.

One of the characteristics of the present invention is to use an anti-migration agent selected from predetermined compounds unlike in the related art. The use of such an anti-migration agent improves the dispersibility of the anti-migration agent in an organic semiconductor layer, and the hindrance to the crystallization of an organic semiconductor is further inhibited. As a result, an organic thin film transistor excellent in the mobility and the insulation reliability is obtained.

Hereinafter, each of the components contained in the composition will be specifically described. First, the organic semiconductor material will be specifically described, and then the anti-migration agent will be specifically described.

<Organic Semiconductor Material>

As the organic semiconductor material contained in the composition of the present invention, it is possible to use known materials used as organic semiconductor layers of organic thin film transistors. Specifically, examples of the material include pentacenes such as 6,13-bis(triisopropylsilylethynyl)pentacene (TIPS pentacene), tetramethylpentacene, and perfluoropentacene, anthradithiophenes such as TES-ADT and diF-TES-ADT, benzothienobenzothiophenes such as DPh-BTBT and Cn-BTBT, dinaphthothienothiophenes such as Cn-DNTT, dioxaanthanthrenes such as perixanthenoxanthene, rubrenes, fullerenes such as C60 and PCBM, phthalocyanines such as copper phthalocyanine and fluorinated copper phthalocyanine, polythiophenes such as P3RT, PQT, and P3HT, polythienothiophenes such as poly[2,5-bis(3-dodecylthiophen-2-yl)thieno[3,2-b]thiophene] (PBTTT), and the like.

<Anti-Migration Agent>

Examples of the anti-migration agent contained in the composition of the present invention include a compound selected from the following compounds X and Y.

Compound X: a compound containing at least two or more groups selected from the group consisting of a group represented by Formula (A) and a group represented by Formula (B)

Compound Y: a compound represented by Formula (C)

Hereinafter, each of the groups in the formulae will be described.

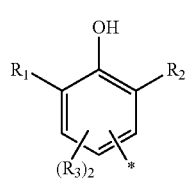

Formula (A)

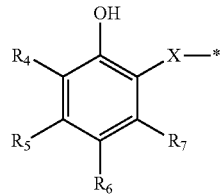

Formula (B)

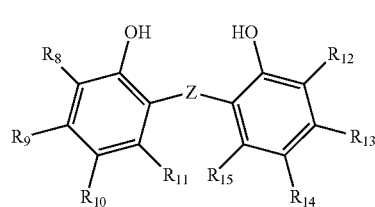

Formula (C)

In Formula (A), each of $R_1$ to $R_3$ independently represents a hydrogen atom or a substituent.

Examples of the substituent include a halogen atom, an alkyl group (including a cycloalkyl group), an alkenyl group (including a cycloalkenyl group and a bicycloalkenyl group), an alkynyl group, an aryl group, a heterocyclic group, a cyano group, a hydroxyl group, a nitro group, a carboxyl group, an alkoxy group, an aryloxy group, a silyloxy group, a heterocyclic oxy group, an acyloxy group, a carbamoyloxy group, an alkoxycarbonyloxy group, an aryloxycarbonyloxy group, an amino group (including an anilino group), an acylamino group, an aminocarbonylamino group, an alkoxycarbonylamino group, an aryloxycarbonylamino group, a sulfamoylamino group, alkyl and aryl sulfonylamino groups, a mercapto group, an alkylthio group, an arylthio group, a heterocyclic thio group, a sulfamoyl group, a sulfo group, alkyl and aryl sulfinyl groups, alkyl and aryl sulfonyl groups, an acyl group, an aryloxycarbonyl group, an alkoxycarbonyl group, a carbamoyl group, an arylazo group, a heterocyclic azo group, an imide group, a phosphino group, a phosphinyl group, a phosphinyloxy group, a phosphinylamino group, a silyl group, and a combination of these.

More specifically, the substituent means a halogen atom (for example, a chlorine atom, a bromine atom, or an iodine atom), an alkyl group [it means a substituted or unsubstituted linear, branched, or cyclic alkyl group; these also include an alkyl group (preferably an alkyl group having 1 to 30 carbon atoms, for example, methyl, ethyl, n-propyl, isopropyl, t-butyl, n-octyl, eicosyl, 2-chloroethyl, 2-cyanoethyl, or 2-ethylhexyl), a cycloalkyl group (preferably a substituted or unsubstituted cycloalkyl group having 3 to 30 carbon atoms, for example, cyclohexyl, cyclopentyl, or 4-n-dodecylcyclohexyl), a bicycloalkyl group (preferably a substituted or unsubstituted bicycloalkyl group having 5 to 30 carbon atoms, that is, a monovalent group obtained by removing one hydrogen atom from bicycloalkane having 5 to 30 carbon atoms, for example, bicyclo[1.2.2]heptan-2-yl or bicyclo[2.2.2]octan-3-yl), a tricyclo structure consisting of a large number of cyclic structures, and the like. An alkyl group in a substituent described below (for example, an alkyl group of an alkylthio group) also means the alkyl group having the concept described above], an alkenyl group [it means a substituted or unsubstituted linear, branched, or cyclic alkenyl group; these also include an alkenyl group (preferably a substituted or unsubstituted alkenyl group having 2 to 30 carbon atoms, for example, vinyl, allyl, prenyl, geranyl, or oleyl), a cycloalkenyl group (preferably a substituted or unsubstituted cycloalkenyl group having 3 to 30 carbon atoms, that is, a monovalent group obtained by removing one hydrogen atom from cycloalkene having 3 to 30 carbon atoms, for example, 2-cyclopenten-1-yl or 2-cyclohexen-1-yl), and a bicycloalkenyl group (a substituted or unsubstituted bicycloalkenyl group and preferably a substituted or unsubstituted bicycloalkenyl group having 5 to 30 carbon atoms, that is, a monovalent group obtained by removing one hydrogen atom from bicycloalkene having one double bond, for example, bicyclo[2.2.1]hept-2-en-1-yl or bicyclo[2.2.2]oct-2-en-4-yl)], an alkynyl group (preferably a substituted or unsubstituted alkynyl group having 2 to 30 carbon atoms, for example, an ethynyl, propargyl, or trimethylsilylethynyl group), an aryl group (preferably a substituted or unsubstituted aryl group having 6 to 30 carbon atoms, for example, phenyl, p-tolyl, naphthyl, m-chlorophenyl, or o-hexadecanoylaminophenyl), a heterocyclic group (preferably a monovalent group obtained by removing one hydrogen atom from a 5- or 6-membered substituted or unsubstituted aromatic or non-aromatic heterocyclic compound, and more preferably a 5- or 6-membered aromatic heterocyclic group having 3 to 30 carbon atoms, for example, 2-furanyl, 2-thienyl, 2-pyrimidinyl, or 2-benzothiazolinyl), a cyano group, a hydroxyl group, a nitro group, a carboxyl group, an alkoxy group (preferably a substituted or unsubstituted alkoxy group having 1 to 30 carbon atoms, for example, methoxy, ethoxy, isopropoxy, t-butoxy, n-octyloxy, or 2-methoxyethoxy), an aryloxy group (preferably a substituted or unsubstituted aryloxy group having 6 to 30 carbon atoms, for example, phenoxy, 2-methylphenoxy, 4-t-butylphenoxy, 3-nitrophenoxy, or 2-tetradecanoylaminophenoxy), a silyloxy group (preferably a silyloxy group having 3 to 20 carbon atoms, for example, trimethylsilyloxy or t-butyldimethylsilyloxy), a heterocyclic oxy group (preferably a substituted or unsubstituted heterocyclic oxy group, for example, having 2 to 30 carbon atoms, 1-phenyltetrazol-5-oxy or 2-tetrahydropyranyloxy), an acyloxy group (preferably a formyloxy group, a substituted or unsubstituted alkylcarbonyloxy group having 2 to 30 carbon atoms, or a substituted or unsubstituted arylcarbonyloxy group having 6 to 30 carbon atoms, for example, formyloxy, acetyloxy, pivaloyloxy, stearoyloxy, benzoyloxy, or p-methoxyphenylcarbonyloxy), a carbamoyloxy group (preferably a substituted or unsubstituted carbamoyloxy group having 1 to 30 carbon atoms, for example, N,N-dimethylcarbamoyloxy, N,N-diethylcarbamoyloxy, morpholinocarbonyloxy, N,N-di-n-octylaminocarbonyloxy, or N-n-octylcarbamoyloxy), an alkoxycarbonyloxy group (preferably a substituted or unsubstituted alkoxycarbonyloxy group having 2 to 30 carbon atoms, for example, methoxycarbonyloxy, ethoxycarbonyloxy, t-butoxycarbonyloxy, or n-octylcarbonyloxy), an aryloxycarbonyloxy group (preferably a substituted or unsubstituted aryloxycarbonyloxy group having 7 to 30 carbon atoms, for example, phenoxycarbonyloxy, p-methoxyphenoxycarbonyloxy, or p-n-hexadecyloxyphenoxycarbonyloxy), an amino group (preferably an amino group, a substituted or unsubstituted alkylamino group having 1 to 30 carbon atoms, or a substituted or unsubstituted anilino group having 6 to 30 carbon atoms, for example, amino, methylamino, dimethylamino, anilino, N-methyl-anilino, or diphenylamino), an acylamino group (preferably a formylamino group, a substituted or unsubstituted alkylcarbonylamino group having 1 to 30 carbon atoms, or a substituted or unsubstituted arylcarbonylamino group having 6 to 30 carbon atoms, for example, formylamino, acetylamino, pivaloylamino, lauroylamino, benzoylamino, or 3,4,5-tri-n-octyloxyphenylcarbonylamino), an aminocarbonylamino group (preferably substituted or unsubstituted aminocarbonylamino having 1 to 30 carbon atoms, for example, carbamoylamino, N,N-dimethylaminocarbonylamino, N,N-diethylaminocarbonylamino, or morpholinocarbonylamino), an alkoxycarbonylamino group (preferably a substituted or unsubstituted alkoxycarbonylamino group having 2 to 30 carbon atoms, for example, methoxycarbonylamino, ethoxycarbonylamino, t-butoxycarbonylamino, n-octadecyloxycarbonylamino, or N-methyl-methoxycarbonylamino), an aryloxycarbonylamino group (preferably a substituted or unsubstituted aryloxycarbonylamino group having 7 to 30 carbon atoms, for example, phenoxycarbonylamino, p-chlorophenoxycarbonylamino, or m-n-octyloxyphenoxycarbonylamino), a sulfamoylamino group (preferably a substituted or unsubstituted sulfamoylamino group having 0 to 30 carbon atoms, for example, sulfamoylamino, N,N-dimethylaminosulfonylamino, or N-n-octylaminosulfonylamino), alkyl and aryl sulfonylamino groups (preferably substituted or unsubstituted alkylsulfonylamino having 1 to 30 carbon atoms and substituted or unsubstituted arylsulfonylamino having 6 to 30 carbon atoms, for example, methylsulfonylamino, butylsulfonylamino, phenylsulfonylamino, or 2,3,5-trichlorophenylsulfonylamino, or p-methylphenylsulfonylamino), a mercapto group, an alkylthio group (preferably a substituted or unsubstituted alkylthio group having 1 to 30 carbon atoms, for example, methylthio, ethylthio, or n-hexadecylthio), an arylthio group (preferably substituted or unsubstituted arylthio having 6 to 30 carbon atoms, for example, phenylthio, p-chlorophenylthio, or m-methoxyphenylthio), a heterocyclic thio group (preferably a substituted or unsubstituted heterocyclic thio group having 2 to 30 carbon atoms, for example, 2-benzothiazolylthio or 1-phenyltetrazol-5-ylthio), a sulfamoyl group (preferably a substituted or unsubstituted sulfamoyl group having 0 to 30 carbon atoms, for example, N-ethylsulfamoyl, N-(3-dodecyloxypropyl)sulfamoyl, N,N-dimethylsulfamoyl, N-acetylsulfamoyl, N-benzoylsulfamoyl, or N—(N'-phenylcarbamoyl)sulfamoyl), a sulfo group, alkyl and aryl sulfinyl groups (preferably a substituted or unsubstituted alkylsulfinyl group having 1 to 30 carbon atoms and a substituted or unsubstituted arylsulfinyl group having 6 to 30 carbon atoms, for example, methylsulfinyl, ethylsulfinyl, phenylsulfinyl, or p-methylphenylsulfinyl), alkyl and aryl sulfonyl groups (preferably a substituted or unsubstituted alkylsulfonyl group having 1 to 30 carbon atoms and a substituted or unsubstituted arylsulfonyl group having 6 to 30 carbon atoms, for example, methylsulfonyl, ethylsulfonyl, phenylsulfonyl, or p-methylphenylsulfonyl), an acyl group (preferably a formyl group, a substituted or unsubstituted alkylcarbonyl group having 2 to 30 carbon atoms, a substituted or unsubstituted arylcarbonyl group having 7 to 30 carbon atoms, or a substituted or unsubstituted heterocyclic carbonyl group having 4 to 30 carbon atoms that is bonded to a carbonyl group through the carbon atoms, for example, acetyl, pivaloyl, 2-chloroacetyl, stearoyl, benzoyl, p-n-octyloxyphenylcarbonyl, 2-pyridylcarbonyl, or 2-furylcarbonyl), an aryloxycarbonyl group (preferably a substituted or unsubstituted aryloxycarbonyl group having 7 to 30 carbon atoms, for example, phenoxycarbonyl, o-chlorophenoxycarbonyl, m-nitrophenoxycarbonyl, or p-t-butylphenoxycarbonyl), an alkoxycarbonyl group (preferably a substituted or unsubstituted alkoxycarbonyl group having 2 to 30 carbon atoms, for example, methoxycarbonyl, ethoxycarbonyl, t-butoxycarbonyl, or n-octadecyloxycarbonyl), a carbamoyl group (preferably substituted or unsubstituted carbamoyl having 1 to 30 carbon atoms, for example, carbamoyl, N-methylcarbamoyl, N,N-dimethylcarbamoyl, N,N-di-n-octylcarbamoyl, or N-(methylsulfonyl)carbamoyl), an arylazo group and a heterocyclic azo group (preferably a substituted or unsubstituted arylazo group having 6 to 30 carbon atoms and a substituted or unsubstituted heterocyclic azo group having 3 to 30 carbon atoms, for example, phenylazo, p-chlorophenylazo, or 5-ethylthio-1,3, 4-thiadiazol-2-ylazo), an imide group (preferably N-succinimide or N-phthalimide), a phosphino group (preferably a substituted or unsubstituted phosphino group having 2 to 30 carbon atoms, for example, dimethylphosphino, diphenylphosphino, or methylphenoxyphosphino), a phosphinyl group (preferably a substituted or unsubstituted phosphinyl group having 2 to 30 carbon atoms, for example, phosphinyl, dioctyloxyphosphinyl, or diethoxyphosphinyl), a phosphinyloxy group (preferably a substituted or unsubstituted phosphinyloxy group having 2 to 30 carbon atoms, for example, diphenoxyphosphinyloxy or dioctyloxyphosphinyloxy), a phosphinylamino group (preferably a substituted or unsubstituted phosphinylamino group having 2 to 30 carbon atoms, for example, dimethoxyphosphinylamino or dimethylaminophosphinylamino), and a silyl group (preferably a substituted or unsubstituted silyl group having 3 to 30 carbon atoms, for example, trimethylsilyl, t-butyldimethylsilyl, or phenyldimethylsilyl).

Among the above functional groups, those having a hydrogen atom may be substituted with the aforementioned groups after the hydrogen atom is removed. Examples of such functional groups include an alkylcarbonylaminosulfonyl group, an arylcarbonylaminosulfonyl group, an alkylsulfonylaminocarbonyl group, an arylsulfonylaminocarbonyl group, and the like. Examples of these include a methylsulfonylaminocarbonyl group, a p-methylphenylsulfonylaminocarbonyl group, an acetylaminosulfonyl group, a benzoylaminosulfonyl group, and the like.

In the present specification, a "substituent" means the groups described above.

Particularly, each of $R_1$ and $R_2$ independently preferably represents a hydrogen atom, an alkyl group, or an alkoxy group, and more preferably represents an alkyl group having 1 to 4 carbon atoms, because either or both of the mobility and the insulation reliability of the obtained organic thin film transistor are further improved (hereinafter, this will be simply written as "because the effects of the present invention are further improved"). Furthermore, because the effects of the present invention are further improved, $R_3$ preferably represents a hydrogen atom or an alkyl group.

Herein, $R_1$ and $R_2$ do not represent a hydrogen atom at the same time.

In the formula, * represents a binding position.

In Formula (B), $R_4$ represents a substituent. The definition of the substituent is as described above.

Particularly, because the effects of the present invention are further improved, $R_4$ preferably represents an alkyl group or an alkoxy group, and more preferably represents an alkyl group having 1 to 4 carbon atoms.

Each of $R_5$ to $R_7$ independently represents a hydrogen atom or a substituent. The definition of the substituent is as described above.

Particularly, because the effects of the present invention are further improved, each of $R_5$ and $R_7$ preferably represents a hydrogen atom or an alkyl group.

$R_6$ preferably represents a hydrogen atom, an alkyl group, or an alkoxy group, and more preferably represents an alkyl group having 1 to 4 carbon atoms.

X represents a divalent linking group. Examples of the divalent linking group include a linear, branched, or cyclic divalent aliphatic hydrocarbon group (for example, an alkylene group having 1 to 12 carbon atoms, more specifically, a methylene group, an ethylene group, a propylene group, or the like), a linear, branched, or cyclic divalent aromatic hydrocarbon group (for example, a phenylene group), —O—, —S—, —SO$_2$—, —NR$_{20}$—, —CO—, —NH—, —COO—, —CONR$_{20}$—, —O—CO—O—, —SO$_3$—, —NHCOO—, —SO$_2$NR$_{20}$—, —NH—CO—NH—, a group formed by combining a plurality of these groups (for example, an alkyleneoxy group, an alkyleneoxycarbonyl group, or an alkylenecarbonyloxy group), and the like. Herein, $R_{20}$ represents a hydrogen atom or an alkyl group having 1 to 5 carbon atoms.

* represents a binding position.

In Formula (C), each of $R_8$ and $R_{12}$ independently represents a substituent. The definition of the substituent is as described above.

Particularly, because the effects of the present invention are further improved, each of $R_8$ and $R_{12}$ independently preferably represents an alkyl group or an alkoxy group, and more preferably represents an alkyl group having 1 to 4 carbon atoms.

Each of $R_9$ to $R_{11}$ and $R_{13}$ to $R_{15}$ independently represents a hydrogen atom or a substituent. The definition of the substituent is as described above.

Particularly, because the effects of the present invention are further improved, each of $R_9$ to $R_{11}$ and $R_{13}$ to $R_{15}$ independently preferably represents a hydrogen atom or an alkyl group, and more preferably represents a hydrogen atom.

Each of $R_9$, $R_{11}$, $R_{13}$, and $R_{15}$ independently preferably represents a hydrogen atom or an alkyl group. Each of $R_{10}$ and $R_{14}$ independently preferably represents a hydrogen atom, an alkyl group, or an alkoxy group, and more preferably represents an alkyl group having 1 to 4 carbon atoms.

Z represents —O—, —S—, —SO—, —SO$_2$—, —NR—, —PR—, —POR—, —COCO—, —NHNH—, or —S—S—.

R represents a hydrogen atom or a substituent. The definition of the substituent is as described above. R preferably represents a hydrogen atom or an alkyl group.

The compound X contains at least two or more groups selected from the group consisting of a group represented by Formula (A) and a group represented by Formula (B). Because the effects of the present invention are further improved, the compound X preferably contains three or more groups described above, and more preferably contains four or more groups described above. The upper limit of the number of the aforementioned groups contained in the compound X is not particularly limited. However, in view of synthesis, the upper limit of the number of the aforementioned groups contained in the compound X is preferably equal to or less than 12, and more preferably equal to or less than 6.

Furthermore, because the effects of the present invention are further improved, the compound X preferably contains at least the group represented by Formula (A), and particularly preferably contains the group represented by Formula (A) in such a number that is within the aforementioned preferred range.

The compound X may be a polymer compound or a low-molecular weight compound. For example, the polymer compound may be a multibranched polymer (a hyperbranched polymer, a dendrimer, or the like).

The molecular weight of the compound X and the compound Y is not particularly limited. However, because the effects of the present invention are further improved, the molecular weight of the compound X and the compound Y is preferably equal to or less than 3,000, and more preferably equal to or less than 2,000. The lower limit of the molecular weight is not particularly limited. However, in view of the crystallinity of the organic semiconductor material, the lower limit of the molecular weight is preferably equal to or greater than 330, and more preferably equal to or greater than 500.

Because the effects of the present invention are further improved, a compound represented by Formula (D) is exemplified as a preferred embodiment of the anti-migration agent.

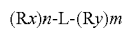

(Rx)n-L-(Ry)m  Formula (D)

In Formula (D), Rx is a group selected from the group consisting of a group represented by Formula (E) and a group represented by Formula (B). The definition of the group represented by Formula (B) is as described above.

The definition of $R_1$ to $R_3$ in the group represented by Formula (E) is the same as the definition of each group in the group represented by Formula (A).

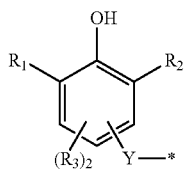

Formula (E)

In Formula (E), Y represents a single bond or a divalent linking group. The definition of the divalent linking group is the same as the definition of the divalent linking group represented by X. Examples of the preferred embodiments of Y include an alkylene group, an amide group, and -$L_{10}$-$L_{11}$-$L_{10}$- ($L_{10}$: an alkylene group, $L_{11}$: an ester group or an amide group), and the alkylene group may contain —O—.

* represents a binding position. Here, $R_1$ and $R_2$ do not represent a hydrogen atom at the same time.

When n is equal to or greater than 2, a plurality Rx's may be the same as or different from each other.

Ry represents a hydrogen atom or a substituent. The definition of the substituent is as described above.

Particularly, because the effects of the present invention are further improved, Ry preferably represents a hydrogen atom, an alkyl group, or an aryl group. When m is equal to or greater than 2, a plurality Ry's may be the same as or different from each other.

L represents an n+m-valent linking group. For example, when n+m=2, L represents a divalent linking group; when n+m=3, L represents a trivalent linking group; when n+m=4, L represents a tetravalent linking group; when n+m=5, L represents a pentavalent linking group; and when n+m=6, L represents a hexavalent linking group.

Because the effects of the present invention are further improved, a group selected from the group consisting of the groups represented by Formulae (1) to (10) is exemplified as a preferred embodiment of L. * represents a binding position.

In Formulae (1), (2), (8), and (9), n+m=2 (n is 2, and m is 0). In Formulae (3) to (5), n+m=3 (n is 2 or 3, and m is 0 or 1). In Formula (6), n+m=4 (n is 2 to 4, and m is 0 to 2). In Formulae (7) and (10), n+m=6 (n is 2 to 6, and m is 0 to 4).

In Formula (10), $L_1$ represents a single bond or a divalent linking group. The definition of the divalent linking group is the same as the definition of the divalent linking group represented by X.

Formula (1)

Formula (2)

Formula (3)

Formula (4)

Formula (5)

Formula (6)

Formula (7)

Formula (8)

Formula (9)

Formula (10)

n represents an integer of 2 to 6, m represents an integer of 0 to 4, and n+m≤6.

Particularly, because the effects of the present invention are further improved, n preferably represents an integer of 2 to 4. Furthermore, m preferably represents an integer of 0 to 2. m is preferably 0.

As a preferred embodiment of the relationship between n and m, an embodiment is exemplified in which n represents an integer of 2 to 4, m represents an integer of 0 to 2, and n+m≤4.

In a preferred embodiment, the molecular weight of the compound represented by Formula (D) is within the range of the molecular weight of the compound X.

The amount of the anti-migration agent contained in the composition of the present invention is not particularly limited. However, because the effects of the present invention are further improved, the amount of the anti-migration agent is preferably equal to or greater than 30 parts by mass, and more preferably equal to or greater than 50 parts by mass, with respect to 100 parts by mass of the organic semiconductor material. Furthermore, the amount of the anti-migration agent is preferably equal to or less than 600 parts by mass, more preferably equal to or less than 300 parts by mass, and even more preferably equal to or less than 200 parts by mass, with respect to 100 parts by mass of the organic semiconductor material.

Examples of the anti-migration agent include the following compounds.

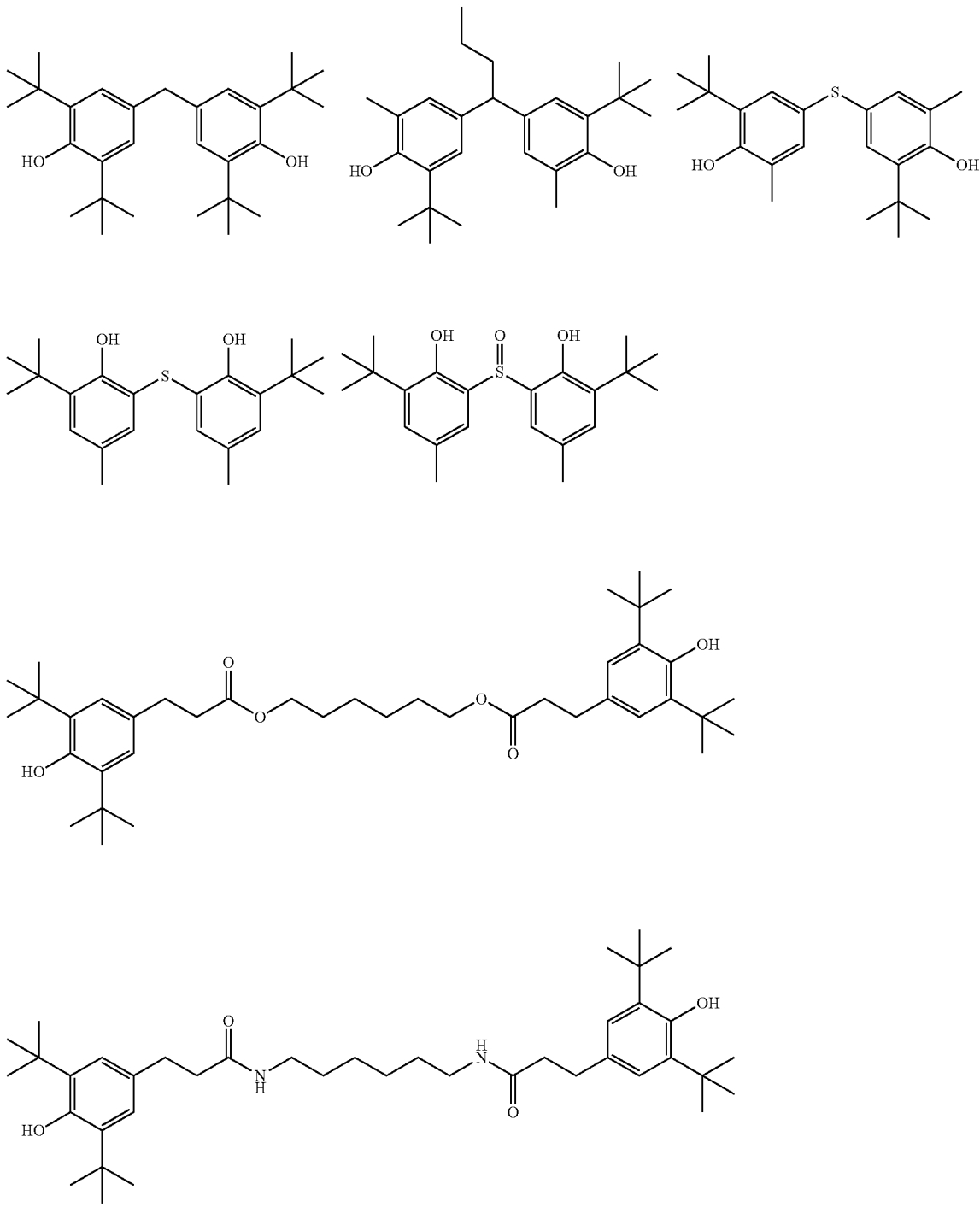

-continued
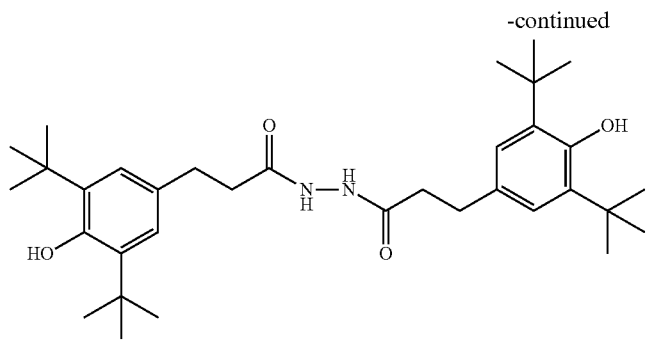
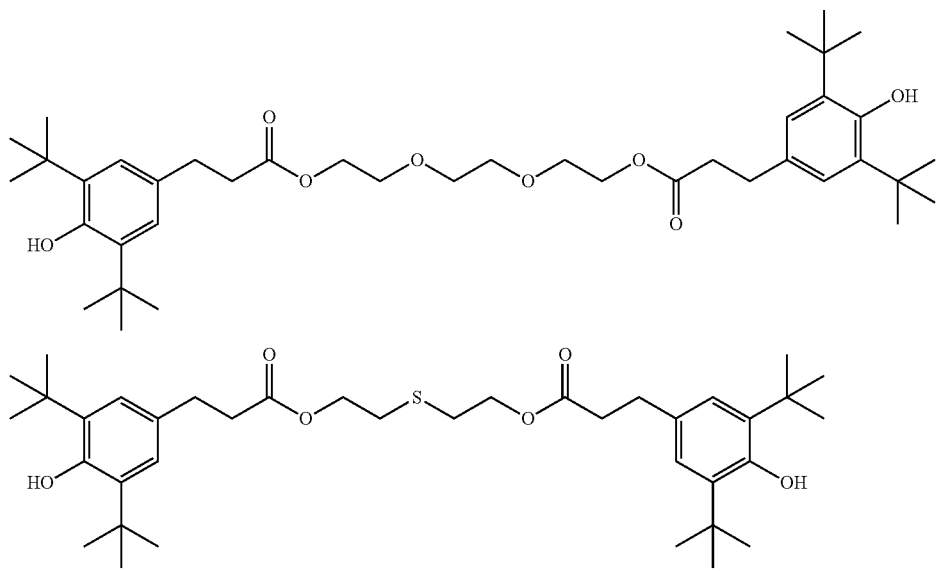
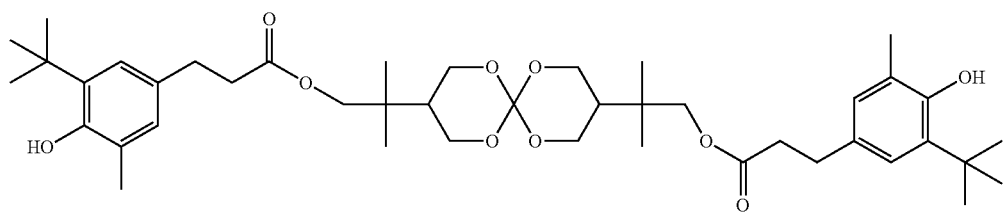
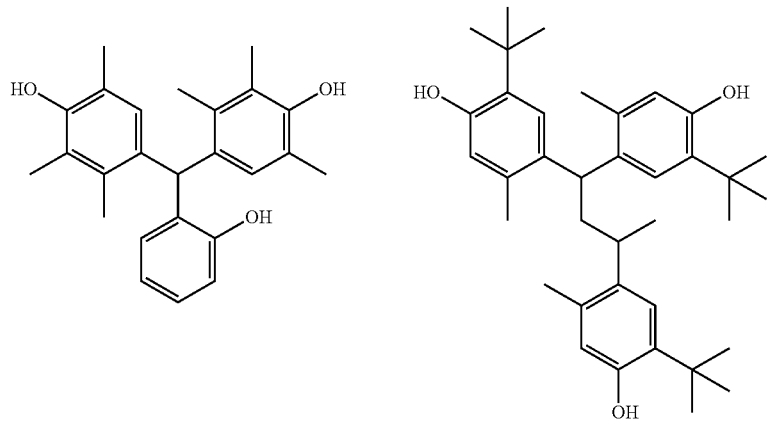

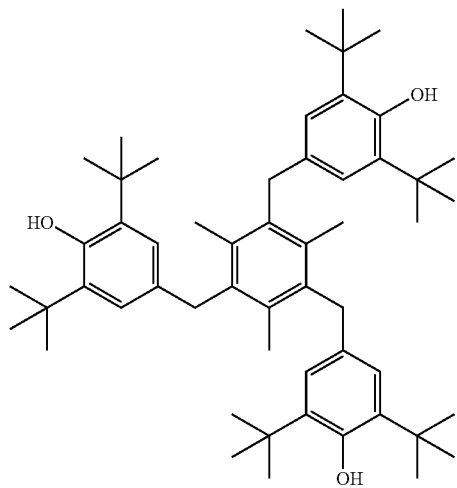
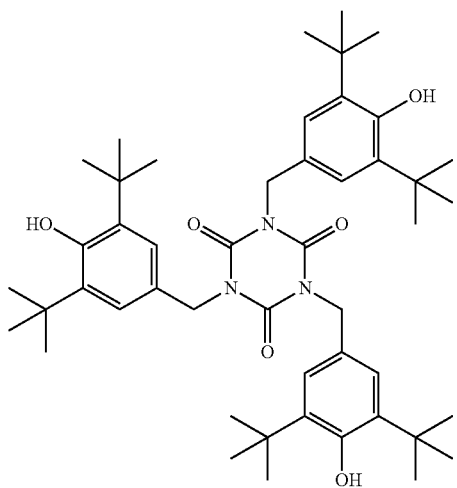
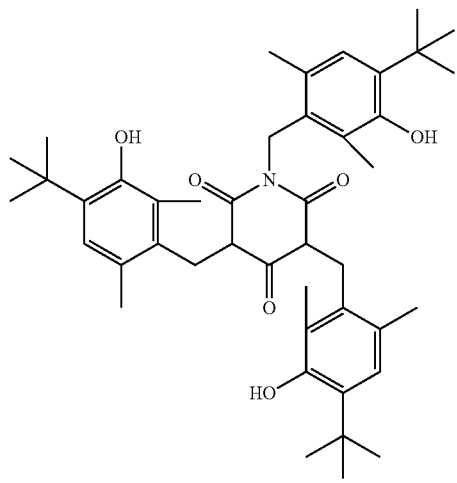
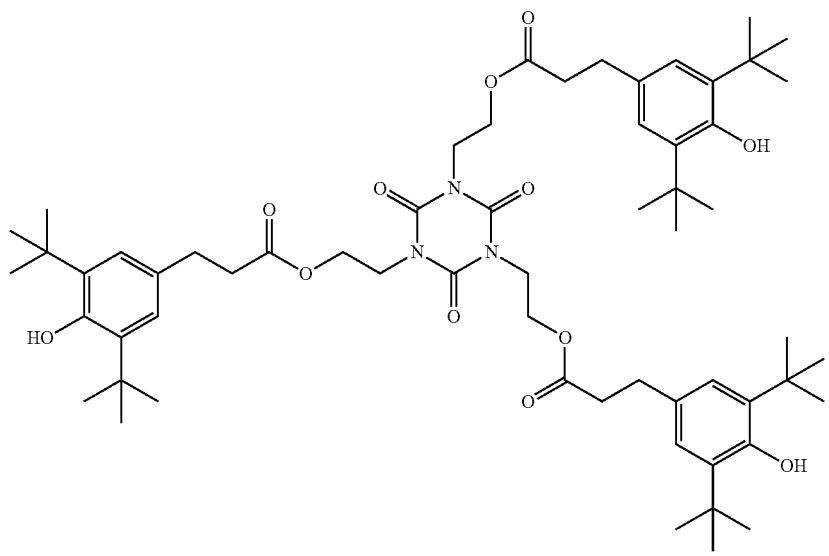

-continued

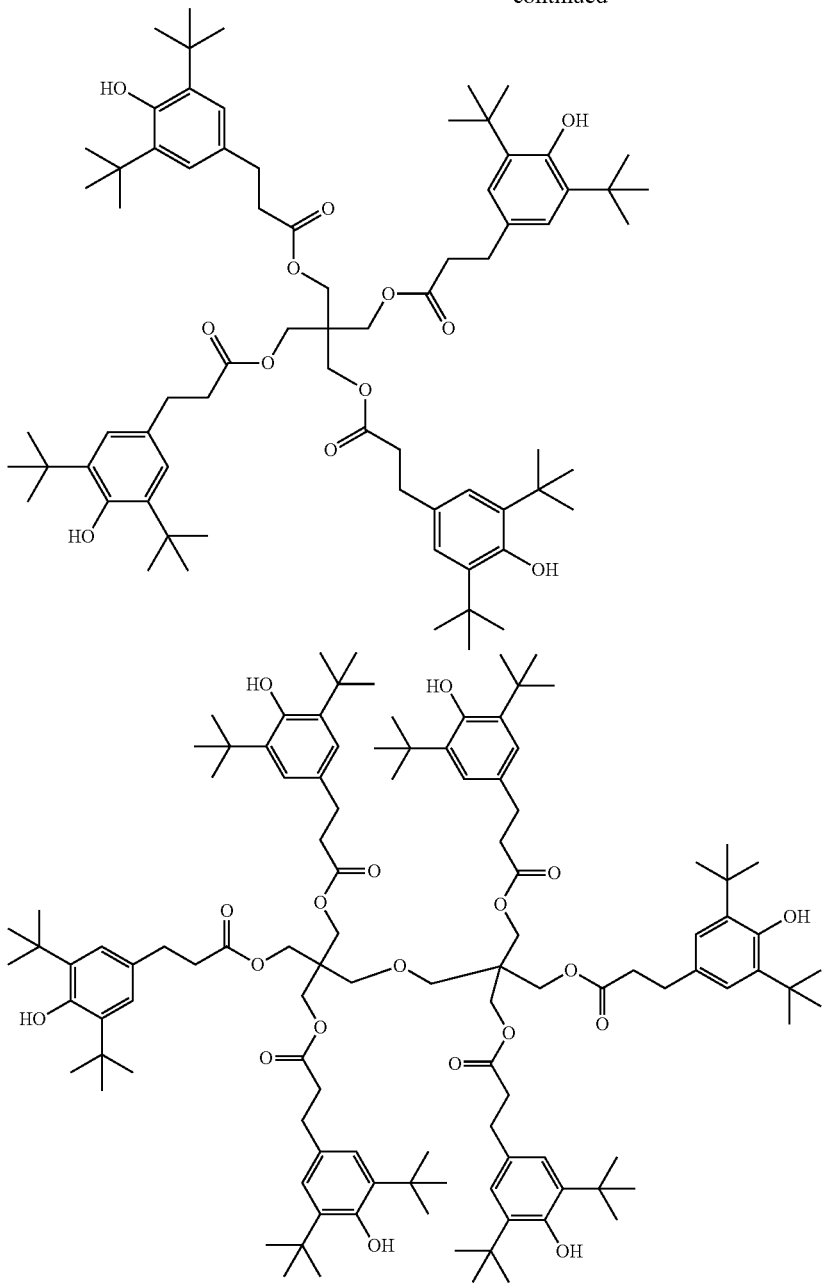

From the viewpoints of the homogeneity and crystallinity of the organic semiconductor layer to be formed, the composition of the present invention preferably contains a solvent.

The solvent is not particularly limited, and preferred examples thereof include aromatic compounds such as toluene, xylene, mesitylene, 1,2,3,4-tetrahydronaphthalene (tetralin), chlorobenzene, dichlorobenzene, and anisole.

As described above, the composition of the present invention exhibits excellent characteristics. Therefore, the composition of the present invention is preferable as a composition forming an organic semiconductor layer of an organic thin film transistor, organic EL, and an organic thin film solar cell. Particularly, the composition of the present invention is particularly preferable as a composition forming an organic semiconductor layer of an organic thin film transistor. The organic thin film transistor is preferably used in electronic paper or a display device.

[Organic Thin Film Transistor]

The organic thin film transistor of the present invention is an organic thin film transistor used in an organic semiconductor layer formed of the composition of the present invention. Particularly, the organic thin film transistor of the present invention is preferably a bottom contact-type organic thin film transistor.

An embodiment of the organic thin film transistor of the present invention will be described with reference to a drawing.

FIG. 1 is a schematic cross-sectional view of an embodiment of the organic thin film transistor of the present invention.

In FIG. 1, an organic thin film transistor 100 includes a substrate 10, a gate electrode 20 which is disposed on the substrate 10, a gate insulating film 30 which covers the gate electrode 20, a source electrode 40 and a drain electrode 42 which come into contact with the surface of the gate insulating film 30 opposite to the gate electrode 20, an organic semiconductor layer 50 which covers the surface of the gate insulating film 30 between the source electrode 40 and the drain electrode 42, and a sealing layer 60 which covers the respective members. Herein, the organic semiconductor layer 50 is formed by using the composition of the present invention. The organic thin film transistor 100 is a bottom contact-type organic thin film transistor.

Hereinafter, embodiments of the substrate, the gate electrode, the gate insulating film, the source electrode, the drain electrode, the organic semiconductor layer, and the sealing layer and methods for forming these members will be specifically described.

<Substrate>

The substrate plays a role of supporting the gate electrode, the source electrode, the drain electrode, and the like which will be described later.

The type of the substrate is not particularly limited, and examples thereof include a plastic substrate, a glass substrate, a ceramic substrate, and the like. Among these, from the viewpoints of the applicability to each device and the cost, a glass substrate or a plastic substrate is preferable.

Examples of the material of the plastic substrate include a thermosetting resin (for example, an epoxy resin, a phenol resin, a polyimide resin, or a polyester resin (such as PET or PEN)) and a thermoplastic resin (for example, a phenoxy resin, a polyethersulfone resin, a polysulfone resin, or a polyphenylenesulfone resin).

Examples of the material of the ceramic substrate include alumina, aluminum nitride, zirconia, silicon, silicon nitride, silicon carbide, and the like.

Examples of the material of the glass substrate include soda glass, potash glass, borosilicate glass, quartz glass, aluminosilicate glass, lead glass, and the like.

<Gate Electrode>

Examples of the material of the gate electrode include a metal such as gold (Au), silver, aluminum, copper, chromium, nickel, cobalt, titanium, platinum, magnesium, calcium, barium, or sodium; a conductive oxide such as $InO_2$, $SnO_2$, or ITO; a conductive polymer such as polyaniline, polypyrrole, polythiophene, polyacetylene, or polydiacetylene; a semiconductor such as silicon, germanium, or gallium arsenide; a carbon material such as fullerene, carbon nanotubes, or graphite; and the like. Among these, a metal is preferable, and silver and aluminum are more preferable.

The thickness of the gate electrode is not particularly limited, but is preferably 20 nm to 200 nm.

The method for forming the gate electrode is not particularly limited, but examples thereof include a method of vacuum vapor-depositing or sputtering an electrode material onto a substrate, a method of coating a substrate with a composition for forming an electrode, a method of printing a composition for forming an electrode onto a substrate, and the like. Furthermore, when the electrode is patterned, examples of the patterning method include a photolithography method; a printing method such as inkjet printing, screen printing, offset printing, or relief printing; a mask vapor deposition method; and the like.

<Gate Insulating Film>

Examples of the material of the gate insulating film include a polymer such as polymethyl methacrylate, polystyrene, polyvinylphenol, polyimide, polycarbonate, polyester, polyvinylalcohol, polyvinyl acetate, polyurethane, polysulfone, polybenzoxazole, polysilsesquioxane, an epoxy resin, or a phenol resin; an oxide such as silicon dioxide, aluminum oxide, or titanium oxide; a nitride such as silicon nitride; and the like. Among these materials, in view of the compatibility with the organic semiconductor layer, a polymer is preferable.

When a polymer is used as the material of the gate insulating film, it is preferable to concurrently use a cross-linking agent (for example, melamine). By the concurrent use of the cross-linking agent, the polymer is cross-linked, and the durability of the formed gate insulating film is improved.

The film thickness of the gate insulating film is not particularly limited, but is preferably 100 nm to 1,000 nm.

The method for forming the gate insulating film is not particularly limited, but examples thereof include a method of coating a substrate, on which the gate electrode is formed, with a composition for forming a gate insulating film, a method of vapor-depositing or sputtering the material of the gate insulating film onto the substrate on which the gate electrode is formed, and the like. The method for coating the aforementioned substrate with the composition for forming a gate insulating film is not particularly limited, and it is possible to use a known method (a bar coating method, a spin coating method, a knife coating method, or a doctor blade method).

When the gate insulating film is formed by coating the substrate with the composition for forming a gate insulating film, for the purpose of removing the solvent, causing cross-linking, or the like, the composition may be heated (baked) after coating.

<Source Electrode and Drain Electrode>

Specific examples of the material of the source electrode and the drain electrode are the same as those exemplified above as the material of the gate electrode. Among the materials, a metal is preferable, and gold is more preferable.

The method for forming the source electrode and the drain electrode is not particularly limited, but examples thereof include a method of vacuum vapor-depositing or sputtering an electrode material onto a substrate on which the gate electrode and the gate insulating film are formed, a method of coating a substrate, on which the gate electrode and the gate insulating film are formed, with a composition for forming an electrode, a method of printing a composition for forming an electrode onto the substrate on which the gate electrode and the gate insulating film are formed, and the like. Specific examples of the patterning method are the same as those exemplified above for the gate electrode.

The channel length of the source electrode and the drain electrode is not particularly limited, but is preferably 5 μm to 30 μm.

The channel width of the source electrode and the drain electrode is not particularly limited, but is preferably 10 μm to 200 μm.

<Organic Semiconductor Layer>

The organic semiconductor layer is a layer formed by using the organic semiconductor composition of the present invention.

The thickness of the organic semiconductor layer is not particularly limited, but is preferably 10 nm to 200 nm.

The method for forming the organic semiconductor layer is not particularly limited, but examples thereof include a method of coating the substrate, on which the gate electrode, the gate insulating film, the source electrode, and the drain electrode are formed, with the organic semiconductor composition, and the like. Specific examples of the method of coating the substrate with the organic semiconductor composition are the same as the examples of the method of coating the substrate with the composition for forming a gate insulating film. When the organic semiconductor layer is formed by coating the substrate with the organic semiconductor composition, for the purpose of removing the solvent, causing cross-linking, or the like, the composition may be heated (baked) after coating.

<Sealing Layer>

From the viewpoint of the durability, the organic thin film transistor of the present invention preferably includes a sealing layer as an outermost layer. In the sealing layer, a known sealant can be used.

The thickness of the sealing layer is not particularly limited, but is preferably 0.2 μm to 10 μm.

The method for forming the sealing layer is not particularly limited, but examples thereof include a method of coating the substrate, on which the gate electrode, the gate insulating film, the source electrode, the drain electrode, and the organic semiconductor layer are formed, with a composition for forming a sealing layer, and the like. Specific examples of the method of coating the substrate with the composition for forming a sealing layer are the same as the examples of the method of coating the substrate with the composition for forming a gate insulating film. When the organic semiconductor layer is formed by coating the substrate with the composition for forming a sealing layer, for the purpose of removing the solvent, causing cross-linking, or the like, the composition may be heated (baked) after coating.

Figure 2:
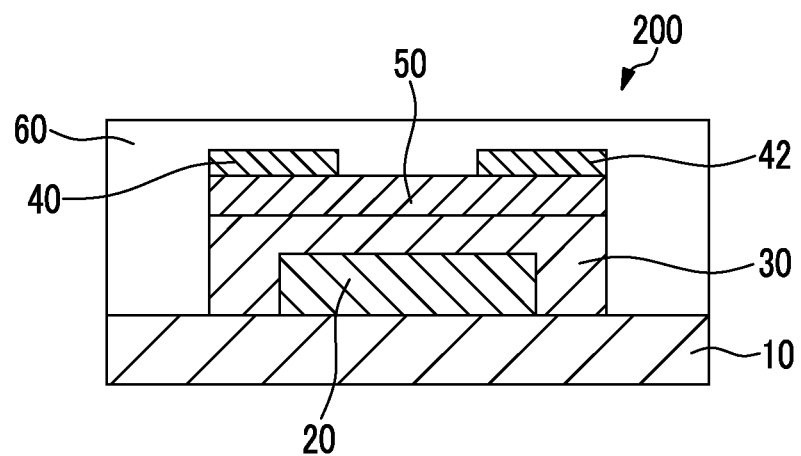
FIG. 2 is a schematic cross-sectional view of another embodiment of the organic thin film transistor of the present invention.

FIG. 2 is a schematic cross-sectional view of another embodiment of the organic thin film transistor of the present invention.

In FIG. 2, an organic thin film transistor 200 includes the substrate 10, the gate electrode 20 which is disposed on the substrate 10, the gate insulating film 30 which covers the gate electrode 20, the organic semiconductor layer 50 which is disposed on the gate insulating film 30, the source electrode 40 and the drain electrode 42 which are disposed on the organic semiconductor layer 50, and the sealing layer 60 which covers the respective members. Herein, the organic semiconductor layer 50 is formed by using the composition of the present invention. The organic thin film transistor 200 is a top contact-type organic thin film transistor.

The substrate, the gate electrode, the gate insulating film, the source electrode, the drain electrode, the organic semiconductor layer, and the sealing layer are as described above.

In FIGS. 1 and 2, the embodiments of the bottom gate-bottom contact type organic thin film transistor and the bottom gate-top contact type organic thin film transistor were specifically described. However, the composition of the present invention can also be applied to a top gate-bottom contact type organic thin film transistor and a top gate-top contact type organic thin film transistor.

EXAMPLES

Hereinafter, the present invention will be more specifically described based on examples, but the present invention is not limited thereto.

In examples and comparative examples which will be described later, organic semiconductor materials and anti-migration agents exemplified below were used.

(A) Organic Semiconductor Material

[a-1]: TIPS pentacene (6,13-bis(triisopropylsilylethynyl)pentacene, manufactured by Sigma-Aldrich Co, LLC.)

[a-2]: diF-TES-ADT (2,8-difluoro-5,11-bis(triethylsilylethynyl)anthradithiophene, manufactured by Sigma-Aldrich Co, LLC.)

[a-3]: PBTTT-C12 (poly[2,5-bis(3-dodecylthiophen-2-yl)thieno[3,2-b]thiophene], manufactured by Sigma-Aldrich Co, LLC.)

[a-4]: P3HT (poly(3-hexylthiophene), manufactured by Sigma-Aldrich Co, LLC.)

(B) Anti-Migration Agent

[b-1]: IRGANOX-245 (manufactured by BASF Japan Ltd.)

[b-2]: IRGANOX-1035 (manufactured by BASF Japan Ltd.)

[b-3]: IRGANOX-1010 (manufactured by BASF Japan Ltd.)

[b-4]: a second-generation polymer (Mw: 1,800) having the same structure as DM-2 described in paragraph "0028" of JP2005-227441A; here, in the present invention, V-1 was used instead of V-18 in DM-2.

[b-5]: a fourth-generation polymer (Mw: 7,500) having the same structure as DM-4 described in paragraph "0030" in JP2005-227441A

[b-6]: IRGANOX-1076 (manufactured by BASF Japan Ltd.)

[b-7]: BHT (2,6-di-tert-butyl-p-cresol, manufactured by Wako Pure Chemical Industries, Ltd.)

[b-8]: IRGANOX-1330 (manufactured by BASF Japan Ltd.)

[b-9]: IRGANOX-3114 (manufactured by BASF Japan Ltd.)

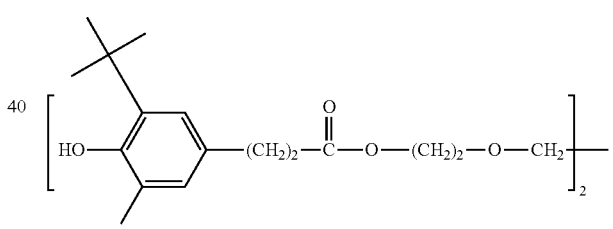

IRGANOX-245

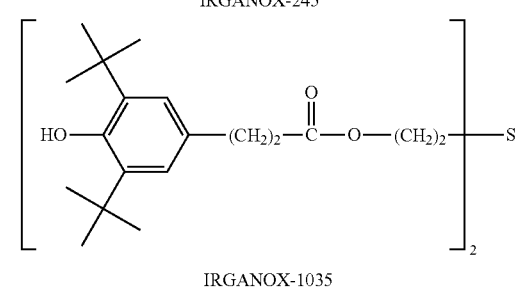

IRGANOX-1035

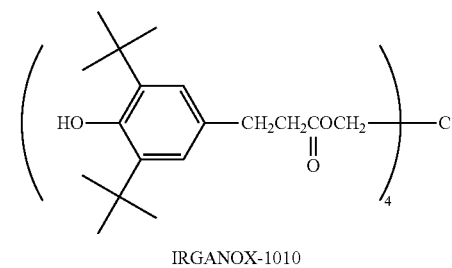

IRGANOX-1010

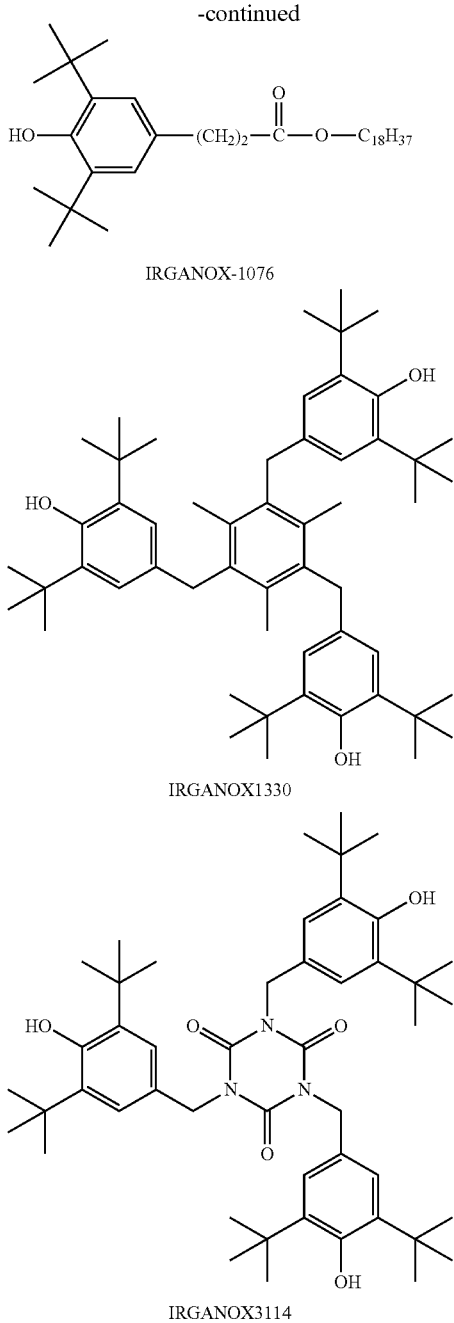

IRGANOX-1076

IRGANOX1330

IRGANOX3114

Example 1

Preparation of Organic Semiconductor Composition

The organic semiconductor material a-1 and the anti-migration agent b-1 were dissolved in toluene (organic semiconductor material a-1/anti-migration agent b-1=100 parts by mass/50 parts by mass (w/w), organic semiconductor concentration: 1.5% by mass), thereby preparing an organic semiconductor composition. The obtained organic semiconductor composition was named a composition 1.

(Preparation of Organic Thin Film Transistor (Element Preparation Method 1))

Al which will become a gate electrode was vapor-deposited (thickness: 50 nm) onto a glass substrate (Eagle XG: manufactured by Corning Incorporated). The Al layer was spin-coated with a composition for forming a gate insulating film (a propylene glycol monomethyl ether acetate (PG-MEA) solution (solution concentration: 2% by mass) of polyvinylphenol/melamine=1 part by mass/i part by mass (w/w)), and the composition was baked for 60 minutes at a temperature of 150° C., thereby forming a gate insulating film having a film thickness of 400 nm. Au was vapor-deposited onto the gate insulating film through a mask, thereby forming a source electrode and a drain electrode having a channel length of 25 μm and a channel width of 180 μm. The source and drain electrodes were spin-coated with the composition 1, and the composition 1 was baked for 15 minutes at a temperature of 140° C., thereby forming an organic semiconductor layer having a thickness of 100 nm. The organic semiconductor layer was spin-coated with Cytop CTL-107MK (composition for forming a sealing layer) (manufactured by ASAHI GLASS CO., LTD), and the Cytop CTL-107MK was baked for 20 minutes at a temperature of 140° C., thereby forming a sealing layer (uppermost layer) having a thickness of 2 μm. In this way, an organic thin film transistor (bottom contact-type) was obtained.

The present preparation method was named an element preparation method 1.

<Evaluation of Mobility>

The electrodes of the obtained organic thin film transistor were respectively connected to the terminals of a manual prober connected to a semiconductor parameter-analyzer (4155C, manufactured by Agilent Technologies Inc.), thereby evaluating the field effect transistor (FET). Specifically, by measuring the drain current-gate voltage (Id-Vg) characteristics, the field effect mobility ([cm$^2$/V·sec]) was calculated. The calculated field effect mobility was denoted by μ1.

Furthermore, according to the same procedure as in the preparation of the composition 1, a comparative composition not containing an anti-migration agent was prepared. Thereafter, an organic thin film transistor was prepared according to the same procedure as in the preparation of an organic thin film transistor of Example 1, except that a comparative composition was used instead of the composition 1. The field effect mobility of the obtained organic thin film transistor was calculated according to the same procedure as followed for calculating μ1. The calculated field effect mobility was denoted by μ2.

From the calculated μ1 and μ2, μ1/μ2 was determined, and the mobility was evaluated according to the following criteria. The results are shown in Table 1. For the practical use, the organic thin film transistor is preferably evaluated to be A to C, more preferably evaluated to be A or B, and even more preferably evaluated to be A, from the viewpoint of the mobility.

| | |
|---|---|
| μ1/μ2≥0.8 | [A]: |
| 0.8>μ1/μ2≥0.5 | [B]: |
| 0.5>μ1/μ2≥0.1 | [C]: |
| 0.1>μ1/μ2 | [D]: |

<Evaluation of Insulation Reliability>

By using EHS-221MD (manufactured by ESPEC CORP), the service life of the obtained organic thin film transistor was tested under the following conditions, thereby measuring a time taken for the value of resistance between the source electrode and the drain electrode to reach $1 \times 10^5 \Omega$. The measured time was denoted by T1.

Temperature: 60° C.
Humidity: RH 60%
Pressure: 1.0 atm
Drain voltage: −40 V
Voltage between source electrode and drain electrode: 20 V Furthermore, according to the same procedure as in the evaluation of mobility, an organic thin film transistor was prepared by using the comparative composition not containing an anti-migration agent. For the obtained organic thin film transistor, the time taken for the value of resistance between the source electrode and the drain electrode to reach $1 \times 10^5 \Omega$ was measured according to the same procedure as followed for measuring T1. The measured time was denoted by T2.

From the calculated T1 and T2, T1/T2 was determined, and the insulation reliability was evaluated according to the following criteria. The results are shown in Table 1. From the viewpoint of the insulation reliability, the organic thin film transistor is preferably evaluated to be A to C, more preferably evaluated to be A or B, and even more preferably evaluated to be A.

$T1/T2 \geq 5$ [A]:

$5 > T1/T2 \geq 2$ [B]:

$2 > T1/T2 \geq 1$ [C]:

$0.1 \geq T1/T2$ [D]:

Example 2

An organic thin film transistor was prepared according to the same procedure as in Example 1, except that the following element preparation method 2 was performed instead of the element preparation method 1. Furthermore, according to the same procedure as in Example 1, various evaluations were performed. The results are summarized in Table 1.

(Preparation of Organic Thin Film Transistor (Element Preparation Method 2))

Al which will become a gate electrode was vapor-deposited (film thickness: 50 nm) onto a glass substrate (Eagle XG: manufactured by Corning Incorporated). The Al layer was spin-coated with a composition for forming a gate insulating film (a PGMEA solution (solution concentration: 2% by mass) of polyvinylphenol/melamine=1 part by mass/1 part by mass (w/w)), and the composition was baked for 60 minutes at a temperature of 150° C., thereby forming an insulating film having a film thickness of 400 nm. The insulating film was spin-coated with the prepared composition 1, and the composition 1 was baked for 15 minutes at a temperature of 140° C., thereby forming an organic semiconductor layer having a film thickness of 100 nm. Thereafter, Ag was vapor-deposited onto the organic semiconductor layer through a mask, thereby forming a source electrode and a drain electrode having a channel length of 25 µm and a channel width of 180 µm. The source and drain electrodes were spin-coated with Cytop CTL-107MK (manufactured by ASAHI GLASS CO., LTD.), and Cytop CTL-107MK was baked for 20 minutes at a temperature of 140° C., thereby forming a sealing layer having a film thickness of 2 µm. In this way, an organic thin film transistor (top contact-type) was prepared. The present preparation method was named an element preparation method 2.

Examples 3 to 14 and Comparative Examples 1 to 3

In Examples 3 to 14 and Comparative examples 1 to 3, the concentration of the organic semiconductor and the type of the solvent were the same as those in the composition 1, and each composition was prepared by mixing the organic semiconductor materials a-1 to a-4 with the anti-migration agents b-1 to b-9 at the mixing ratio described in Table 1.

By using the compositions obtained in Examples 3 to 14 and Comparative examples 1 to 3, organic thin film transistors were prepared according to the element preparation method 1 and the element preparation method 2 as shown in Table 1, and various evaluations were performed. The results are summarized in Table 1.

At the time of performing the evaluations, as an organic semiconductor material in the comparative composition, a-1 was used in Examples 1 to 4, 13, and 14, a-2 was used in Examples 5 and 6, a-3 was used in Examples 7 and 8, and a-4 was used in Examples 9 to 12.

In Table 1, "mass ratio of (A)/(B)" means a mass ratio of "(A) organic semiconductor material" to "(B) anti-migration agent".

TABLE 1

Part 1

| | | Example 1 | Example 2 | Example 3 | Example 4 | Example 5 | Example 6 | Example 7 | Example 8 |
|---|---|---|---|---|---|---|---|---|---|
| Composition | (A) organic semiconductor material | a-1 | a-1 | a-1 | a-1 | a-2 | a-2 | a-3 | a-3 |
| | (B) anti-migration agent | b-1 | b-1 | b-2 | b-3 | b-3 | b-3 | b-1 | b-1 |
| | Mass ratio of (A)/(B) | 2 | 2 | 2 | 2 | 4 | 1 | 3 | 0.6 |
| Element preparation method | | 1 | 2 | 1 | 1 | 1 | 1 | 1 | 1 |
| Evaluation | Mobility | A | A | A | A | B | A | B | A |
| | Insulation reliability | B | B | B | A | B | A | B | A |

TABLE 2

Part 2

| | | Example 9 | Example 10 | Example 11 | Example 12 | Example 13 | Example 14 | Comparative example 1 | Comparative example 2 | Comparative example 3 |
|---|---|---|---|---|---|---|---|---|---|---|
| Composition | (A) organic semiconductor material | a-4 | a-4 | a-4 | a-4 | a-1 | a-1 | a-1 | a-3 | a-4 |
| | (B) anti-migration agent | b-3 | b-3 | b-4 | b-5 | b-8 | b-9 | b-6 | b-7 | b-7 |
| | Mass ratio of (A)/(B) | 5 | 1 | 3 | 3 | 2 | 2 | 5 | 20 | 10 |

TABLE 2-continued

Part 2

| | Example 9 | Example 10 | Example 11 | Example 12 | Example 13 | Example 14 | Comparative example 1 | Comparative example 2 | Comparative example 3 |
|---|---|---|---|---|---|---|---|---|---|
| Element preparation method | 1 | 1 | 1 | 1 | 1 | 1 | 2 | 1 | 2 |
| Evaluation Mobility | B | A | A | B | A | A | D | D | D |
| Insulation reliability | A | A | B | B | A | A | B | C | C |

As shown in Table 1, when the composition of the present invention was used, the insulation reliability of the organic thin film transistor could be improved without greatly reducing the mobility of the organic thin film transistor.

Particularly, as is evident from the comparison between Examples 3 and 4, it was confirmed that when the total number of the group represented by Formula (A) and the group represented by Formula (B) is equal to or greater than 3 (preferably equal to or greater than 4), the insulation reliability is further improved.

Furthermore, as is evident from the comparison between Examples 11 and 12, it was confirmed that when the molecular weight is equal to or less than 3,000, the mobility is further improved.

In addition, from the comparison between Examples 5 and 6, between Examples 7 and 8, and between Examples 9 and 10, it was confirmed that when the mass ratio of (A)/(B) is equal to or less than 2.0, the effects of the present invention are further improved.

In contrast, in Comparative examples 1 to 3 in which the antioxidant specifically disclosed in JP2005-5582A was used, either or both of the mobility and the insulation reliability were poorer than in examples.

EXPLANATION OF REFERENCES

10: substrate
20: gate electrode
30: gate insulating film
40: source electrode
42: drain electrode
50: organic semiconductor layer
60: sealing layer
100, 200: organic thin film transistor

What is claimed is:

1. An organic semiconductor composition comprising:
   an organic semiconductor material; and
   an anti-migration agent containing at least either a compound X, which contains at least two or more groups selected from the group consisting of a group represented by Formula (A) and a group represented by Formula (B), or a compound Y which is represented by Formula (C), wherein the amount of the anti-migration agent is equal to or greater than 50 parts by mass with respect to 100 parts by mass of the organic semiconductor material,

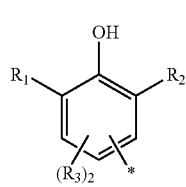

Formula (A)

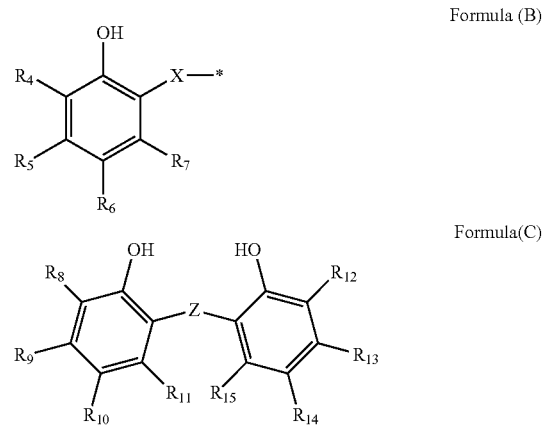

(in Formula (A), each of $R_1$ to $R_3$ independently represents a hydrogen atom or a substituent; * represents a binding position; and $R_1$ and $R_2$ do not represent a hydrogen atom at the same time, in Formula (B), $R_4$ represents a substituent; each of $R_5$ to $R_7$ independently represents a hydrogen atom or a substituent; X represents a divalent linking group; and * represents a binding position, and in Formula (C), each of $R_8$ and $R_{12}$ independently represents a substituent; each of $R_9$ to $R_{11}$ and $R_{13}$ to $R_{15}$ independently represents a hydrogen atom or a substituent; Z represents —O—, —S—, —SO—, —SO$_2$—, —NR—, —PR—, —POR—, —COCO—, —NH—NH—, or —S—S—; and R represents a hydrogen atom or a substituent).

2. The organic semiconductor composition according to claim 1,
   wherein the molecular weight of the compound X and the compound Y is equal to or less than 3,000.

3. The organic semiconductor composition according to claim 2,
   wherein the anti-migration agent is a compound represented by Formula (D), $$(Rx)n\text{-}L\text{-}(Ry)m \qquad \text{Formula (D)}$$

(in Formula (D), Rx represents a group selected from the group consisting of a group represented by Formula (E) and a group represented by Formula (B); when n is equal to or greater than 2, a plurality Rx's may be the same as or different from each other; Ry represents a hydrogen atom or a substituent; when m is equal to or greater than 2; a plurality of Ry's may be the same as or different from each other; L represents an n+m-valent group; n represents an integer of 2 to 6; m represents an integer of 0 to 4; and n+m≤6, and in Formula (E), each of $R_1$ to $R_3$ independently represents a hydrogen atom or a substituent;

Y represents a single bond or a divalent linking group; * represents a binding position, and $R_1$ and $R_2$ do not represent a hydrogen atom at the same time)

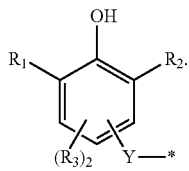

Formula (E)

4. The organic semiconductor composition according to claim 3,
wherein L is any one selected from the group consisting of groups represented by Formulae (1) to (10), and
in Formula (10), $L_1$ represents a single bond or a divalent linking group, and * represents a binding position

Formula (1)

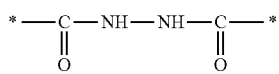

Formula (2)

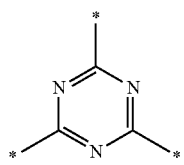

Formula (3)

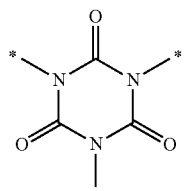

Formula (4)

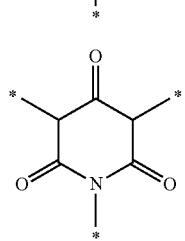

Formula (5)

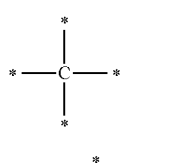

Formula (6)

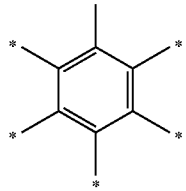

Formula (7)

Formula (8)

Formula (9)

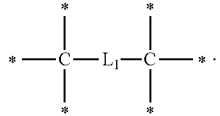

Formula (10)

5. The organic semiconductor composition according to claim 2,
wherein the anti-migration agent is the compound X, and
the total number of the group represented by Formula (A) and the group represented by Formula (B) contained in the compound X is equal to or greater than 3.

6. An organic semiconductor layer prepared by using the organic semiconductor composition according to any one of claim 2.

7. An organic thin film transistor comprising:
an organic semiconductor layer prepared by using the organic semiconductor composition according to claim 2;
a source electrode;
a drain electrode; and
a gate electrode.

8. The organic semiconductor composition according to claim 1,
wherein the anti-migration agent is a compound represented by Formula (D), $(Rx)n\text{-}L\text{-}(Ry)m$   Formula (D)

(in Formula (D), Rx represents a group selected from the group consisting of a group represented by Formula (E) and a group represented by Formula (B); when n is equal to or greater than 2, a plurality Rx's may be the same as or different from each other; Ry represents a hydrogen atom or a substituent; when m is equal to or greater than 2; a plurality of Ry's may be the same as or different from each other; L represents an n+m-valent group; n represents an integer of 2 to 6; m represents an integer of 0 to 4; and n+m≤6, and in Formula (E), each of $R_1$ to $R_3$ independently represents a hydrogen atom or a substituent; Y represents a single bond or a divalent linking group; * represents a binding position, and $R_1$ and $R_2$ do not represent a hydrogen atom at the same time)

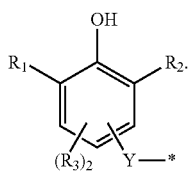

Formula (E)

9. The organic semiconductor composition according to claim 8,
wherein L is any one selected from the group consisting of groups represented by Formulae (1) to (10), and
in Formula (10), $L_1$ represents a single bond or a divalent linking group, and * represents a binding position

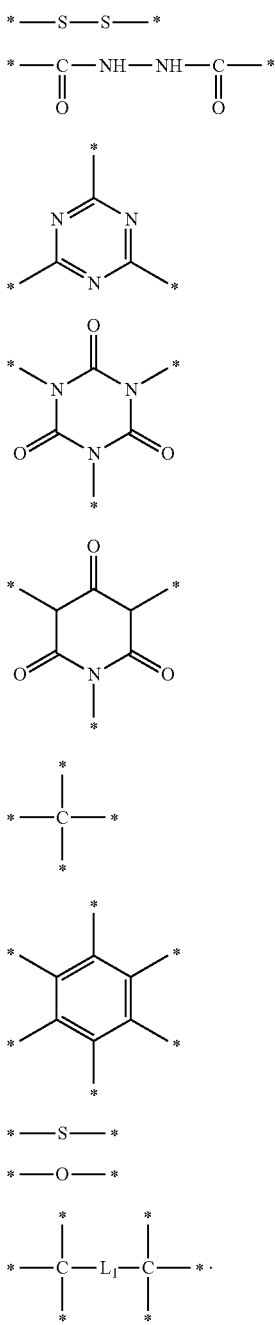

10. An organic semiconductor layer prepared by using the organic semiconductor composition according to claim 9.

11. An organic thin film transistor comprising:

an organic semiconductor layer prepared by using the organic semiconductor composition according to claim 9;

a source electrode;

a drain electrode; and a gate electrode.

12. An organic semiconductor layer prepared by using the organic semiconductor composition according to claim 8.

13. An organic thin film transistor comprising:

an organic semiconductor layer prepared by using the organic semiconductor composition according to claim 8;

a source electrode;

a drain electrode; and a gate electrode.

14. The organic semiconductor composition according to claim 1, wherein the anti-migration agent is the compound X, and the total number of the group represented by Formula (A) and the group represented by Formula (B) contained in the compound X is equal to or greater than 3.

15. An organic semiconductor layer prepared by using the organic semiconductor composition according to claim 14.

16. An organic semiconductor layer prepared by using the organic semiconductor composition according to any one of claim 1.

17. An organic thin film transistor comprising:

an organic semiconductor layer prepared by using the organic semiconductor composition according to claim 1;

a source electrode;

a drain electrode; and a gate electrode.

18. The organic thin film transistor according to claim 17, wherein at least one electrode selected from the group consisting of the source electrode, the drain electrode, and the gate electrode contains silver.

19. Electronic paper comprising the organic thin film transistor according to claim 17.

20. A display device comprising the organic thin film transistor according to claim 17.

\* \* \* \* \*